United States Patent
Zhang et al.

(10) Patent No.: US 9,419,076 B1
(45) Date of Patent: Aug. 16, 2016

(54) BIPOLAR JUNCTION TRANSISTOR

(71) Applicant: Altera Corporation, San Jose, CA (US)

(72) Inventors: Weimin Zhang, San Jose, CA (US); Yanzhong Xu, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/563,363

(22) Filed: Dec. 8, 2014

Related U.S. Application Data

(60) Provisional application No. 61/916,494, filed on Dec. 16, 2013.

(51) Int. Cl.
| | |
|---|---|
| *H01L 29/78* | (2006.01) |
| *H01L 29/06* | (2006.01) |
| *H01L 29/737* | (2006.01) |
| *H01L 29/66* | (2006.01) |
| *H01L 21/306* | (2006.01) |
| *H01L 21/02* | (2006.01) |
| *H01L 29/16* | (2006.01) |
| *H01L 21/308* | (2006.01) |
| *H01L 29/739* | (2006.01) |
| *H01L 29/73* | (2006.01) |

(52) U.S. Cl.
CPC ...... *H01L 29/0692* (2013.01); *H01L 21/02532* (2013.01); *H01L 21/308* (2013.01); *H01L 21/30604* (2013.01); *H01L 29/0649* (2013.01); *H01L 29/16* (2013.01); *H01L 29/66242* (2013.01); *H01L 29/66795* (2013.01); *H01L 29/73* (2013.01); *H01L 29/739* (2013.01); *H01L 29/7371* (2013.01); *H01L 29/785* (2013.01)

(58) Field of Classification Search
None
See application file for complete search history.

(56) References Cited

U.S. PATENT DOCUMENTS

| | | | | |
|---|---|---|---|---|
| 8,541,270 B2* | 9/2013 | Yeh | ................... | H01L 29/66818 257/E21.405 |
| 2013/0075729 A1* | 3/2013 | Xia | ................... | H01L 29/66272 257/51 |
| 2013/0228830 A1* | 9/2013 | Lee | ................... | H01L 29/66795 257/288 |
| 2014/0302653 A1* | 10/2014 | Yeh | ................... | H01L 29/66818 438/283 |
| 2014/0353760 A1* | 12/2014 | Loubet | ........... | H01L 21/823821 257/369 |
| 2015/0041898 A1* | 2/2015 | Loubet | .................. | H01L 29/785 257/347 |

* cited by examiner

*Primary Examiner* — Minh-Loan Tran

(57) ABSTRACT

A bipolar junction transistor (BJT) is formed in a thin (less than about 20 nanometers) segment of a semiconductive material such as silicon where a lower portion of the semiconductive material has doping of a first conductivity type and forms a collector and an upper portion of the semiconductive material has doping of a second conductivity type and forms a base. Either a metal or a polysilicon emitter is formed on the base. An illustrative method for forming the BJT comprises forming first and second layers of a semiconductive material having first and second conductivity types, respectively; forming a hard mask on an upper surface of the second layer; using the hard mask to etch first and second channels in the semiconductive material on first and second opposing sides of the hard mask; removing the hard mask; and forming an emitter on the upper surface of the second layer.

25 Claims, 5 Drawing Sheets

BIPOLAR JUNCTION TRANSISTOR

CROSS-REFERENCE TO RELATED APPLICATION

This application claims benefit of provisional application Ser. No. 61/916,494, filed Dec. 16, 2013, for "BIPOLAR JUNCTION TRANSISTOR," the contents of which are incorporated herein by reference.

BACKGROUND

This relates to a bipolar junction transistor formed in one or more thin segments of a semiconductive material similar to those used in the fins of FinFETS (a/k/a Tri-gates). A fin is a thin segment of semiconductive material standing on edge, thereby making available multiple surfaces for the formation of gate structures. Fins have first and second major surfaces that are opposite one another and usually are symmetric about a center plane that bisects the fin lengthwise. The major surfaces are often illustrated as being parallel as in U.S. Pat. No. 7,612,405 B2 or Pub. No. US2008/0128797 A1, which are incorporated herein by reference; but process limitations usually result in surfaces that slope outwardly from top to bottom of the fin with the result that the cross-section of the fin is trapezoidal in shape. In some cases, the sidewalls meet at the top to provide a triangular cross-section. FinFETs are under intensive development with efforts being made to make them thinner while also increasing their aspect (height/thickness) ratios. In 2012, Intel reported on a 22 nanometer (nm.) bulk FinFET that had a thickness of approximately 8 nm and a height of approximately 35 nm.

SUMMARY

The present invention is a bipolar junction transistor (BJT) formed in a fin-like structure. In an illustrative embodiment it comprises at least one thin segment of a semiconductive material such as silicon where a lower portion of the semiconductive material has doping of a first conductivity type and forms a collector and an upper portion of the semiconductive material has doping of a second conductivity type and forms a base. Either a metal or a polysilicon emitter is formed on the base.

An illustrative method for forming the BJT comprises forming first and second layers of a semiconductive material having first and second conductivity types, respectively; forming a hard mask on an upper surface of the second layer; using the hard mask to etch first and second channels in the semiconductive material on first and second opposing sides of the hard mask; removing the hard mask; and forming an emitter on the upper surface of the second layer.

The invention provides superior current gain in a BJT at least in part by exploiting tunneling current. A high gain BJT has applications such as in high gain differential amplifiers. The invention can also be integrated easily into existing fabrication processes and has good scaling potential.

Numerous variations may be practiced in the preferred embodiment.

BRIEF DESCRIPTION OF THE DRAWINGS

These and other objects and advantages of the present invention will be apparent to those of ordinary skill in the art in view of the following detailed description in which.

DETAILED DESCRIPTION

Figure 1:
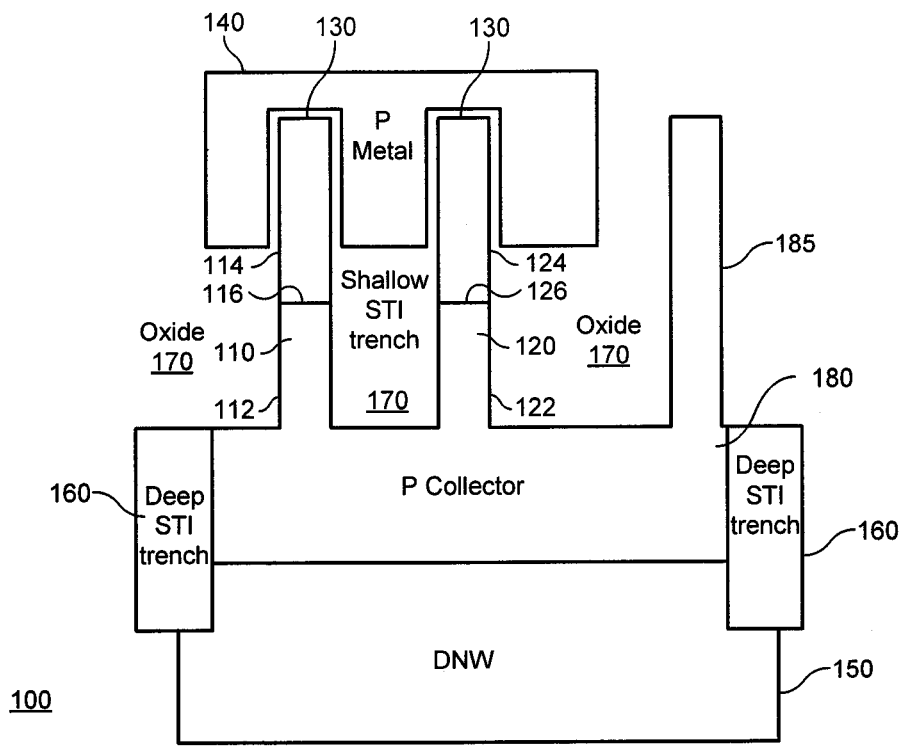
FIG. 1 is a cross-section of a first illustrative embodiment of the invention.

FIG. 1 is a cross-section of a first illustrative embodiment 100 of a BJT of the invention. Embodiment 100 comprises two thin segments 110, 120 of a semiconductive material such as silicon. A lower portion 112, 122 of segments 110, 120 has P-type conductivity and functions as the collector; and an upper portion 114, 124 of segments 110, 120 has N-type conductivity and functions as the base. PN junctions 116, 126 are formed at the interfaces between the upper and lower portions of segments 110, 120. A dielectric layer 130 is located on the outer surface of upper portions 114, 124; and a metal emitter 140 is formed on the dielectric layer and connected to all the segments. Embodiment 100 is formed on a deep N-type well (DNW) 150 and is isolated from other circuits by a deep STI trench 160. A shallow STI trench oxide 170 fills the space between the thin segments. The lower portions 112, 114 are connected together by a portion 180 of the material in which they are formed; and an external connection 185 is made to this portion.

As will be appreciated, the two segments 110, 120 shown in embodiment 100 are only illustrative. Other embodiments of the invention may have a single segment or more than two segments.

Figure 2:
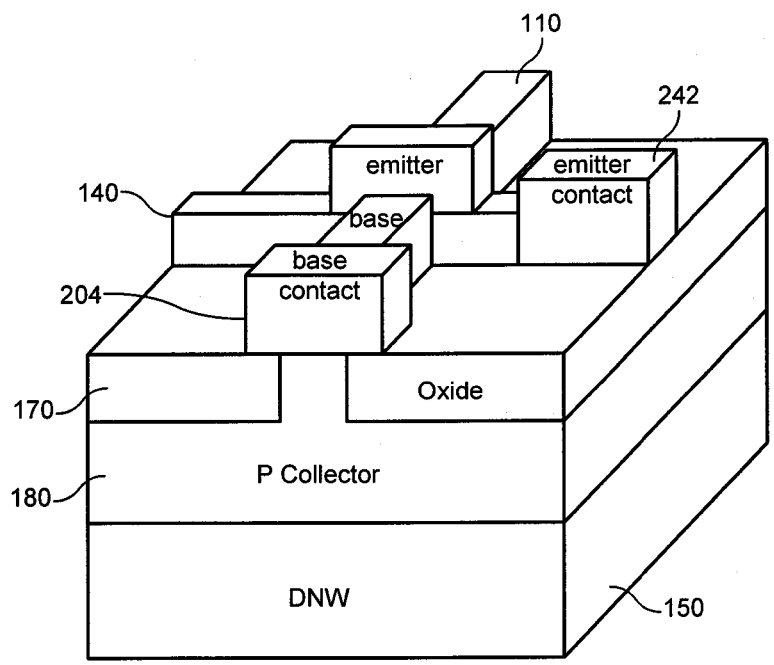
FIG. 2 is a perspective view of a portion of the illustrative embodiment of FIG. 1.

FIG. 2 is a perspective view of a portion of embodiment 100 showing only a single segment 110. Other elements of FIG. 1 that are shown in FIG. 2 bear the same element numbers. FIG. 2 also shows a base contact 204 and an emitter contact 242.

Figure 3:
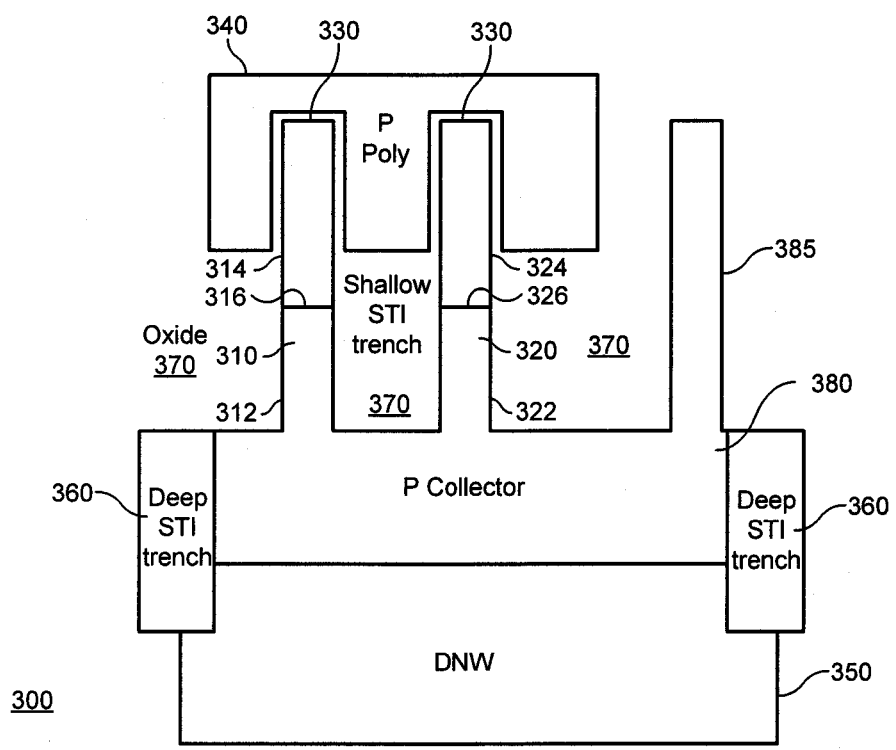
FIG. 3 is a cross-section of a second illustrative embodiment of the invention.

FIG. 3 is a cross-section of a second illustrative embodiment 300 of a BJT of the invention which is similar to the embodiment of FIG. 1 except for the emitter. Embodiment 300 comprises two thin segments 310, 320 of a semiconductive material such as silicon. A lower portion 312, 314 of segments 310, 320 has P-type conductivity and functions as the collector; and an upper portion 314, 324 of segments 310, 320 has N-type conductivity and functions as the base. PN junctions 316, 326 are formed at the interfaces between the upper and lower portions of segments 310, 320. A dielectric layer 330 is located on the outer surface of upper portions 314, 324; and a polysilicon emitter 340 is formed on the dielectric layer and connected to all the segments. Embodiment 300 is formed on a deep N-type well (DNW) 350 and is isolated from other circuits by a deep STI trench 360. A shallow STI trench oxide 370 fills the space between the thin segments. The lower portions 312, 314 are connected together by a portion 380 of the material in which they are formed; and an external connection 385 is made to this portion.

Figure 4:
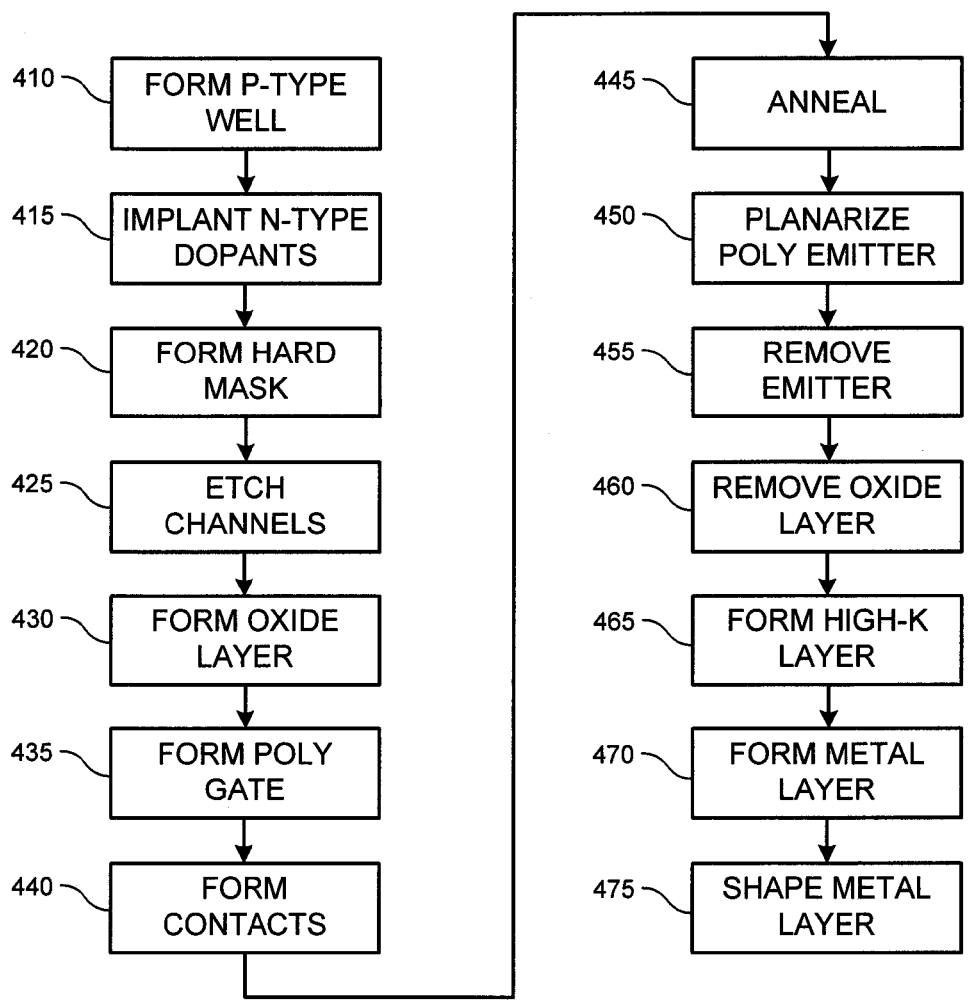
FIG. 4 is a flowchart of an illustrative process for making the embodiment of FIG. 1.

FIG. 4 is a flow chart depicting an illustrative method for forming BJT 100 of FIG. 1. Illustratively, the starting material is a wafer of a semiconductive material such as silicon in which a multitude of integrated circuits are being formed. At step 410, a P-type well is formed in a deep N-type well. Illustratively, step 410 is performed simultaneously with the formation of other P-type wells for other structures in the integrated circuits. At step 415, the upper portion of the P-type well is implanted with suitable dopants to convert the upper portion to N-type. Illustratively, step 415 is performed simultaneously with the channel doping of any FinFETs or with another implant of N-type dopants of an appropriate concentration.

Figure 5:
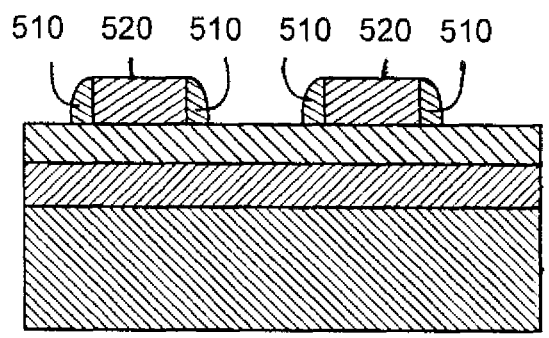
FIGS. 5 and 6 depict certain steps in the flowchart of FIG. 4.
Figure 6:
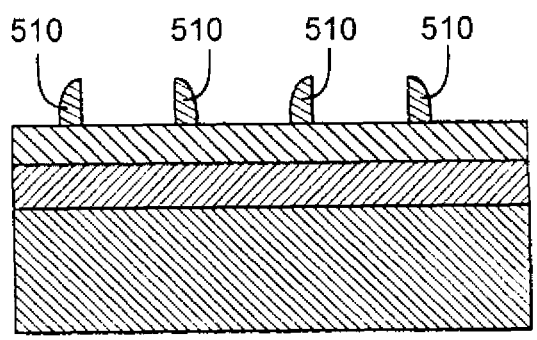
Figure 7:
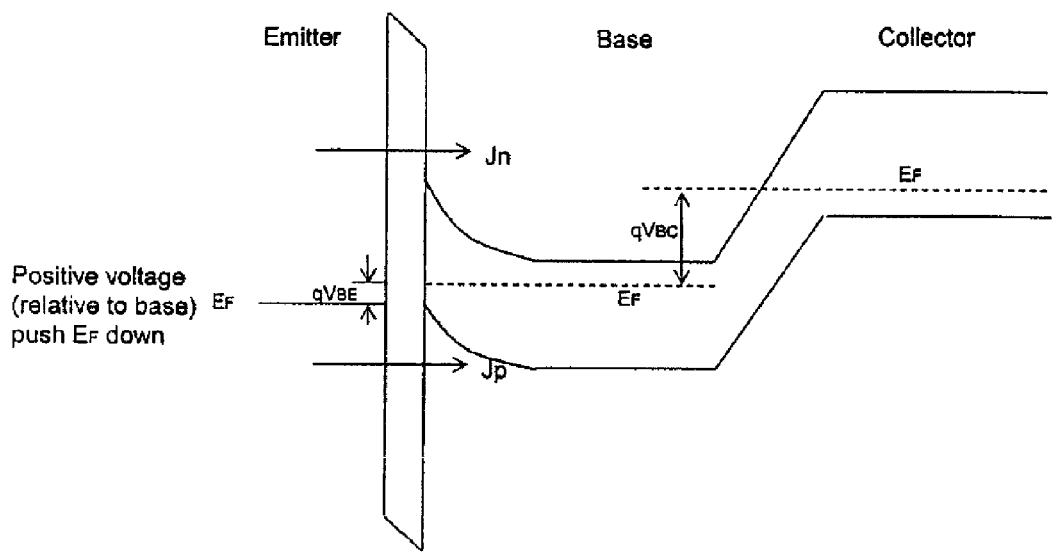
FIG. 7 is a bandgap diagram for a PNP BJT of the present invention.

At step 420, a hard mask is formed on the upper surface of the upper portion of the P-type well. Illustratively, the hard mask has first and second opposing sides that are separated by a distance of approximately 20 nanometers or less and, more preferably, 10 nanometers or less. Illustratively, other hard masks could be formed simultaneously with step 420 for use in forming other structures in the integrated circuits such as FinFETs. Typically, the hard mask is a silicon nitride spacer 510 formed on the sidewall of a dummy gate 520 as shown in FIG. 5. The dummy gate is removed after the spacer is formed as shown in FIG. 6.

At step 425, the hard mask is used to etch first and second channels on the first and second sides of the hard mask. The channels are etched to below the PN junctions 116, 126 between the upper portion of the semiconductive material and the lower portion. Illustratively, similar channels could be etched simultaneously with step 425 on opposite sides of other hard masks on the integrated circuits to form structures such as FinFETS. Illustratively, the depth of the etched channels is 20 to 50 nanometers.

The hard mask is then removed and a sacrificial layer of oxide is formed at step 430 on the surfaces of the thin segment of semiconductive material. A polysilicon gate is then formed at step 435 on the oxide layer. Illustratively, as steps 430 and 435 are being performed, the same steps may be used to form polysilicon gates on the oxide layers of other devices in the integrated circuits such as FinFETs.

At step 440, heavily doped N-type and P-type regions are formed in the semiconductive material to provide contacts for at least the base and collector regions and for the emitter region if the final form of the BJT will use the polysilicon gate. Simultaneously with step 440, contacts may also be formed for other P-type and N-type regions for other devices in the integrated circuit.

At step 445, the BJT is annealed. Simultaneously, everything else in the integrated circuit is subjected to the same process.

If the final form of the BJT is to have a polysilicon emitter, the major steps in formation of the BJT have now been completed. If the final form of the BJT is have a metal gate, the process continues at step 450 with planarization of the polysilicon emitter followed at step 455 with removal of the emitter. If desired, the oxide layer may also be removed at step 460 and replaced at step 465 with a high-K dielectric layer. At step 470, a metal layer may be formed on the fin and the layer may then be processed at step 475 to produce its final shape.

Simultaneously with the execution of steps 450, 455, 460, 465, 470 and 475, the same steps can be performed on other structures such as FinFETs to produce metal gates on high-K dielectric layers.

FIG. 5 is a bandgap diagram for a PNP BJT of the present invention that uses a metal gate. It is to be noted that hole tunneling is greatly favored over electron tunneling with high work function metal. The emitter current will increase as the oxide thickness decreases or the metal work function decreases.

While the invention has been described in the context of a PNP BJT and a PNP BJT is preferred, the invention may also be practiced to make a NPN BJT. Appropriate modifications to the foregoing description to make a NPN BJT will be evident in view of the foregoing disclosure.

As will be apparent to those skilled in the art, numerous variations may be practiced within the spirit and scope of the present invention. For example, the invention may be practiced using semiconductive materials other than silicon, such as using graded silicon germanium (SiGe) in the base region. Various implants can be used to form the collector and/or base regions of the BJT. Additional implants and process modifications can be used to enhance performance of the BJT. In the interest of brevity, many well known details of semiconductor manufacturing processes have been left out of the foregoing description.

What is claimed is:

1. A bipolar junction transistor comprising
at least a first thin segment of a semiconductive material having first and second opposing major surfaces, the segment having a lower portion that has a first conductivity type and an upper portion that has a second conductivity type;
a dielectric layer on the upper portion of the first and second major surfaces; and
a conducting layer on the dielectric layer.

2. The transistor of claim 1 wherein the conducting layer functions as an emitter, the upper portion of the semiconductive material as a base and the lower portion as a collector.

3. The transistor of claim 1 wherein the semiconductive material is silicon.

4. The transistor of claim 1 wherein the first thin segment of semiconductive material is approximately 20 nanometers thick or less.

5. The transistor of claim 1 wherein the first thin segment of semiconductive material is approximately 10 nanometers thick or less.

6. The transistor of claim 1 wherein the semiconductive material has a height of approximately 20 to 50 nanometers.

7. A bipolar junction transistor comprising:
an emitter;
a base; and
a collector
wherein at least the base and the collector are located in a thin segment of semiconductive material having first and second opposing major surfaces, the thin segment having a lower portion in which the collector is located that has a first conductivity type and an upper portion in which the base is located that has a second conductivity type.

8. The transistor of claim 7 wherein the semiconductive material is silicon.

9. The transistor of claim 7 wherein segment of semiconductive material is approximately 20 nanometers thick or less.

10. The transistor of claim 7 wherein segment of semiconductive material is approximately 10 nanometers thick or less.

11. The transistor of claim 7 wherein the semiconductive material has a height of approximately 20 to 50 nanometers.

12. A bipolar junction transistor having an emitter, a base and a collector formed by:
forming a first layer of a semiconductive material having a first conductivity type;
forming on the first layer a second layer of the same semiconductive material having a second conductivity type;
forming a hard mask on an upper surface of the second layer, the hard mask having first and second opposing sides with a distance of less than 20 nanometers between them;
using the hard mask to etch first and second channels in the semiconductive material on the first and second opposing sides of the hard mask, the channels extending into the first layer, wherein the first layer comprises the collector and the second layer comprises the base;

removing the hard mask; and forming an emitter on the upper surface of the second layer.

13. The transistor of claim 12 wherein the emitter is formed by forming an insulating layer on the second layer and forming a metal layer on the insulating layer.

14. The transistor of claim 12 wherein the hard mask is formed by forming a spacer on a sidewall of a gate structure and removing the gate structure after the spacer is formed.

15. The transistor of claim 12 wherein the semiconductive material is silicon.

16. A bipolar junction transistor comprising:

at least a first thin segment of a semiconductive material having first and second opposing major surfaces;

a collector having a first conductivity type and located in a first portion of the first thin segment;

a base having a second conductivity type and located in a second portion of the first thin segment adjacent the first portion with a PN junction between the first and second portions; and an emitter on the second portion of the first thin segment.

17. The transistor of claim 16 wherein the emitter comprises a dielectric layer on the second portion and a conducting layer on the dielectric layer.

18. The transistor of claim 17 wherein the conducting layer is a polysilicon layer.

19. The transistor of claim 17 wherein the conducting layer is a metal layer.

20. The transistor of claim 16 wherein the semiconductive material is silicon.

21. The transistor of claim 16 wherein the first thin segment of semiconductive material is approximately 20 nanometers thick.

22. The transistor of claim 16 wherein the first thin segment of semiconductive material is approximately 10 nanometers thick or less.

23. The transistor of claim 16 wherein the semiconductive material has a height of approximately 20 to 50 nanometers.

24. The transistor of claim 16 wherein the collector has P-type conductivity and the base has N-type conductivity.

25. The transistor of claim 16 wherein the collector has N-Type conductivity and the base has P-type conductivity.

* * * * *